United States Patent [19]

Nikawa et al.

[11] Patent Number: 5,422,498
[45] Date of Patent: Jun. 6, 1995

[54] APPARATUS FOR DIAGNOSING INTERCONNECTIONS OF SEMICONDUCTOR INTEGRATED CIRCUITS

[75] Inventors: Kiyoshi Nikawa; Yasuko Hanagama; Toyokazu Nakamura, all of Tokyo, Japan

[73] Assignee: NEC Corporation, Tokyo, Japan

[21] Appl. No.: 227,241

[22] Filed: Apr. 13, 1994

[30] Foreign Application Priority Data

Apr. 13, 1993 [JP] Japan .................................. 5-085817
Dec. 14, 1993 [JP] Japan .................................. 5-313320

[51] Int. Cl.⁶ ............................................ G01R 31/00
[52] U.S. Cl. ....................................... 257/48; 257/431; 437/8; 324/451; 324/501; 356/237; 374/45
[58] Field of Search ................. 257/48, 431, 629, 767; 437/8; 324/451, 501, 522, 523, 691; 356/237; 374/45, 57

[56] References Cited

U.S. PATENT DOCUMENTS 4,874,251 10/1989 Thomas et al. ........................ 374/45
5,042,952 8/1991 Opsal et al. .......................... 356/432
5,049,811 9/1991 Dreyer et al. ..................... 324/158 R

OTHER PUBLICATIONS

By K. Haraguchi, "Detection of defect point and failure analysis in semiconductor devices", pp. 140–144 and English abstract. Date and journal of publication unknown.
By W. Smith et al., "Direct Measurement of Stress-Induced Void Growth by Thermal Wave Modulated Optical Reflectance Imaging", pp. 200–209; 1990 IRPS, date of publication unknown.

*Primary Examiner*—Sara W. Crane
*Attorney, Agent, or Firm*—Young & Thompson

[57] ABSTRACT

The invention provides an apparatus for diagnosing a void within a conductive material for interconnections of semiconductor integrated circuits. A laser beam irradiating section is provided for supplying a thermal wave to interconnections of the semiconductor integrated circuits to cause a rise of a temperature of the conductive material due to a thermal accumulation around a void within the conductive material, the thermal wave supplying section being able to move in a plane for accomplishment of a scanning operation of the thermal wave supply. A voltage applying section is connected to the interconnections. A current detecting section is connected to the interconnections for detecting an amount of an electrical current flowing through any part of the interconnections to sense a variation of the amount thereof on account of the rise of the temperature of the conductive material due to the thermal accumulation around the void within the conductive material so as to detect any void within the conductive material.

22 Claims, 7 Drawing Sheets

APPARATUS FOR DIAGNOSING INTERCONNECTIONS OF SEMICONDUCTOR INTEGRATED CIRCUITS

BACKGROUND OF THE INVENTION

The present invention relates to an apparatus for diagnosing semiconductor integrated circuits, and more particularly to an apparatus for detecting and measuring any void in a metal constituting interconnections of semiconductor integrated circuits.

For the semiconductor integrated circuits, requirements of improvements in high performance, high integration and minimization are no doubt being on the increase. Needless to say, establishment of good techniques for diagnosing semiconductor integrated circuits would also be extremely important in order to discriminate the perfect semiconductor integrated circuits from defective integrated circuits. Various techniques for diagnosing semiconductor integrated circuits have been known in the art to which the invention pertains.

One of the conventional techniques for diagnosing the semiconductor integrated circuits has been well known as an optical beam induced current method (an OBIC method). K. Haraguchi reported an improvement of the optical beam induced current method in its sensitivity and resolving power in "Detection of Defect Point and Failure Analysis in Semiconductor Device by OBIC" in which defects existing within a semiconductor material may be detectable by the optical beam induced current method, whose phenomenon will hereinafter be described with reference to FIGS. 1 to 3.

The optical beam induced current method is available for detecting any crystal defects in a semiconductor crystal structure. Phenomenon of the optical beam induced current method is as follows. A laser beam is irradiated on an intrinsic semiconductor in which the irradiated laser beam has such a wavelength as able to generate electron-hole pairs within the semiconductors. Such electrons and holes generated by the irradiation of the laser beams are drifted to move in the opposite directions to each other under an electric field since the intrinsic semiconductor is biased as illustrated in FIG. 1. Such drifts of individual carriers, for example, electrons and holes appear as an electrical drift current when the electric field in the semiconductor is greater than an electrostatic potential. The optical beam induced current is this current.

When the semiconductor includes some crystal defects, resistivity of the semiconductor at a point adjacent to the defects is higher than that at the remaining portion where the semiconductor has a perfect crystal structure. Such rise of the resistivity of the semiconductor around the defects causes some reduction of an amount of the optical beam induced current around the defects in the semiconductor. Irradiation of the laser beam on the semiconductor at a point adjacent to the crystal defects results in a reduction of the optical beam induced current. Thus, scanning of the laser beam irradiation on the semiconductor and a measurement of the optical beam induced current are able to sense positions of the crystal defects within the semiconductor. This optical beam induced current method is able to readily detect the crystal defects within the semiconductor even if the crystal defects exist at the inside of the semiconductor.

The above optical beam induced current method is available for diagnosing a semiconductor p-n junction which is biased in the reverse direction as illustrated in FIG. 2. When the p-n junction semiconductor is in reverse biased, a space charge region is formed at the junction surface. When a laser beam is irradiated on a surface of the space charge region in which the laser beam has such a wavelength or a frequency as able to generate electron-hole pairs or carriers, electrons and holes as carriers are drifted to move in the opposite directions to each other. This results in an appearance of an electrical drift current which represents an optical beam induced current. It would therefore be possible to sense the existence of the space charge region at the p-n junction by both scanning the irradiation of the laser beam across over semiconductors of opposite conductivity types and subsequent detection of the optical beam induced current.

As described above, the optical beam induced current method would be available for diagnosing the semiconductor material and thus be able to detect the crystal defects within the semiconductor materials only. This indicates that the optical beam induced current is not available for detecting any crystal imperfection of metals such as voids. Needless to say, the above prior art seems inapplicable to the detection of voids within the metals constituting the interconnections of the semiconductor integrated circuits.

Serious problems with diagnosing the semiconductor integrated circuit chip would surly be that the optical beam induced current is incapable of diagnosing the interconnections of metals in the semiconductor integrated circuits as its phenomenon is in utilizing the electron-hole pair generation, which appears in the semiconductor material, by irradiating the laser beam having such a wavelength as able to cause the electron-hole pair generation. For that reason, the above mentioned prior art method may be regarded as an imperfect diagnosing method for the semiconductor integrated circuits.

It have therefore been required to establish any method for diagnosing the interconnections of metals within the semiconductor integrated circuits namely any method for detecting voids existing in the metals constituting the interconnections of the semiconductor integrated circuits.

One of diagnosing methods for interconnections of the semiconductor integrated circuits is disclosed in 1990 IRPS (IEEE) pp. 200–208, W. Lee Smith at al. "DIRECT MEASUREMENT OF STRESS-INDUCED VOID GROWTH BY THERMAL WAVE MODULATED OPTICAL REFERENCE IMAGING". This method is applicable to diagnosing the interconnections of the semiconductor integrated circuit chips. This method is so called as a thermal wave modulated optical reflectance imaging method which permits efficient detections and measurements of any substantial voids in metals. When the laser beam is irradiated on a surface of void free metal having a perfect crystal structure, a thermal wave is generated at a beam spot of the metal surface and then radially and uniformly propagated into the inside of the metal as illustrated in FIG. 3. In contrast, the laser beam is irradiated on a surface of a metal involving some voids, an impedance of the propagation of the thermal waves appears around the void as illustrated in FIG. 4. This results in somewhat thermal accumulation around the void due to the impedance of the thermal wave propagation at a portion in the vicinity of the voids. Such thermal accumulation around the voids causes somewhat rise of resistivity of the metal adjacent to the voids. This reason is such that the resistivity of the metal is risen by rising a temperature of the metal which has been well known. Therefore, it could readily be understood that the measurement of any variation of the electrical resistivity of the metal by irradiation of the laser beam on the metal permits the detection of existence of the voids within the metal even if an invisible void exists at the inside of the substance of the metal.

The above described thermal wave modulated optical reflectance imaging system is illustrated in FIG. 5. The thermal wave modulated optical reflectance imaging system includes two lasers, for example, a HeNe probe laser for outputting a laser beam having a constant intensity and an Ar ion pump laser for outputting another laser beam having a variation in a sine wave of its intensity. The pump laser is connected through a modulator and a first beam expander to a first dichroic beam combiner. The first dichroic beam combiner is connected through an auto-focus to an objective lens. On the other hand, the probe laser is connected through a beam expander, a second dichroic beam combiner, a ¼ wave plate to the first dichroic beam combiner. A photo-detector is connected through a HeNe filter to the second beam combiner. A pump laser beam is outputted from the pump laser to be transmitted through the modulator and the beam expander to the first beam combiner. A probe laser beam is outputted from the probe laser to be transmitted through the beam expander, the second beam combiner and the ¼ wave plate to the first beam combiner. The pump laser beam and the probe laser beam are combined by the first beam combiner to be transmitted through the auto focus and the objective lens to a sample metal which is mounted on a sample holder and motion system. The laser beam is then reflected by the sample metal and revered through the auto focus to the first beam combiner where the reflected laser beam is turned to the second beam combiner through the auto focus. This sample holder and motion system is so designed as able to move in a plane for scanning the laser beam irradiation on an entire surface of the sample metal as illustrated in FIG. 5. The cause of the motion of the measured sample is as follows. As described above, the thermal wave modulated optical reflectance imaging apparatus is considerably large. It is therefore difficult to move such apparatus in the plane for scanning the laser beam irradiation on the entire surface of the sample metal. When the sample is such high density integrated circuit interconnections, it is much more difficult to realize the exact scanning of the laser beam irradiation on the interconnections of the metals in such semiconductor integrated circuits. For those reasons, the sample holder and motion system on which the sample metal is mounted is so moved in the plane as to realize the scanning of the laser beam irradiation on the interconnections of the semiconductor integrated circuits for diagnosing the crystal perfectiveness of the metals constituting the interconnections, while the thermal wave modulated optical reflectance imaging apparatus is secured at a predetermined position.

Although the above thermal wave modulated optical reflectance imaging apparatus is able to detect and measure any voids in the metals constituting the interconnections of the semiconductor integrated circuit, the above apparatus would be engaged with the following disadvantages.

The above thermal wave modulated optical reflectance imaging method may be considered as a costly and time-consuming method for detecting and measuring voids in the metals constituting the interconnections of the semiconductor integrated circuits. The expensive and time-consuming apparatus are due to the following reasons. As mentioned above, this conventional thermal wave modulated optical reflectance imaging apparatus employs the two laser devices, for example, one is the pump laser and another is the probe laser. For that reason, to accomplish the scanning operation for detecting and measuring any void within the metal, it is required to accomplish a precise alignment between pump and probe laser devices. Actually, it was however difficult to accomplish such a precise and exact alignment between the pump and probe laser devices during the scanning for diagnosing the interconnections of the semiconductor integrated circuits. Moreover, it was difficult for the conventional thermal wave modulated optical reflectance imaging apparatus to accomplish a high speed scanning for diagnosing the interconnections of the semiconductor integrated circuits since the sample holder and motion system for holding any sample such as a semiconductor integrated circuit chip would be moved on a plane while the apparatus is secured at a predetermined position.

Needless to say, it has been required to establish the exact diagnosing system for detecting and measuring any void within metals particularly interconnections of the semiconductor integrated circuits.

SUMMARY OF THE INVENTION

Accordingly, it is a primary object of the present invention to provide a novel diagnosing apparatus for detecting and measuring any void within a metal in which the method is free from any problems as described above.

It is an object of the present invention to provide a novel diagnosing apparatus for detecting and measuring any void within a metal constituting interconnections of semiconductor integrated circuits.

It is a further object of the present invention to provide a novel inexpensive diagnosing apparatus for detecting and measuring any void within a metal constituting interconnections of semiconductor integrated circuits.

It is a further more object of the present invention to provide a novel diagnosing apparatus for detecting and measuring any void within a metal constituting interconnections of semiconductor integrated circuits in which the apparatus is able to accomplish the exact scanning operation for diagnosing the interconnections in a short time.

It is a still further object of the present invention to provide a novel diagnosing apparatus for detecting and measuring any void within a metal constituting interconnections of semiconductor integrated circuits in which the apparatus has a possible simple structure free of any extra laser device.

The above and other objects, features and advantages of the present invention will be apparent from the following descriptions.

The present invention provides an apparatus for diagnosing a void within a conductive material constituting interconnections of semiconductor integrated circuits. The apparatus includes a sample hold section being secured at a predetermined position at least during a diagnosing operation for holding the semiconductor integrated circuits. The apparatus also includes a thermal wave supplying section for supplying a thermal wave to interconnections of the semiconductor integrated circuits to cause a rise of a temperature of the conductive material due to a thermal accumulation around a void within the conductive material in which the thermal wave supplying section is able to move in a plane for accomplishing a scanning operation of the thermal wave supply. The apparatus also includes a voltage applying section being electrically connected to the interconnections of the semiconductor integrated circuits for applying a voltage to the interconnection so as to have an electrical current flow through a part of said interconnections, said part of which is about to be diagnosed. The apparatus also includes a current detecting section being electrically connected to the interconnections for detecting an amount of an electrical current flowing through any part of the interconnections to sense a variation of the amount thereof on account of the rise of the temperature of the conductive material due to the thermal accumulation around the void within the conductive material so as to detect any void within the conductive material constituting the interconnections. The apparatus also includes a temperature control section being thermally connected to the semiconductor integrated circuits for controlling a temperature of the semiconductor integrated circuits at a suitable value to obtain a possible high sensitivity in detecting any void within the conductive material. The apparatus also includes a system control section being electrically connected to at least each of the voltage applying section, the current detecting section and the temperature control section for both receiving informations as to an amount of the electrical current detected by the current detecting section and subsequently controlling both a voltage supplying operation of the voltage supplying section and a temperature control operation of the temperature control section to keep at least during the diagnosing operation the semiconductor integrated circuits having a temperature at which an amount of the electrical current to be detected by the current detecting section be minimum to obtain a possible high sensitivity in detecting any void within the conductive materials constituting the interconnections. The apparatus also includes a signal and image data processing section being electrically connected to each of the system control section, the thermal wave supplying section and the current detecting section for both receiving from the thermal wave supplying section an information as to a present diagnosing position of the interconnections and receiving an information as to the amount of the electrical current from the current detecting section to analyze both the informations and subsequently process the analyzed informations as image data. The apparatus also includes a display section being electrically connected to the signal and image processing section for displaying visible images of any void involved in the semiconductor integrated circuits according to the analyzed image data.

The laser beam irradiating section of the apparatus according to the present invention further includes a laser beam wavelength control section for controlling a wavelength of a laser beam to be irradiated on the semiconductor integrated circuits in which the laser beam is so controlled as to have a wavelength longer than a critical wavelength at which an optical beam induced current is generated. The voltage applying section may comprise a LSI tester which has an ability to apply electrical current not only to general interconnections but also compusorily to a particular interconnection which objects any current application except in an exceptional state if the LSI tester is not provided.

BRIEF DESCRIPTION OF THE DRAWINGS

Preferred embodiments of the present invention will hereinafter fully be described in detail with reference to the accompanying drawings.

DETAILED DESCRIPTION OF THE INVENTION

Figure 1:
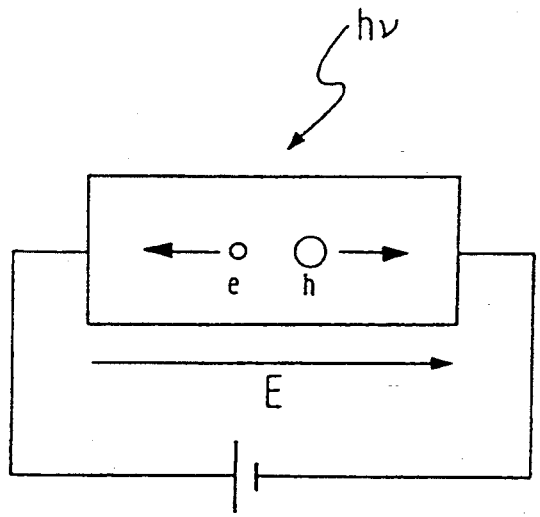
FIG. 1 is a diagram to explain a mechanism of generation of the optical beam induced current in an intrinsic semiconductor biased by a predetermined voltage.
Figure 2:
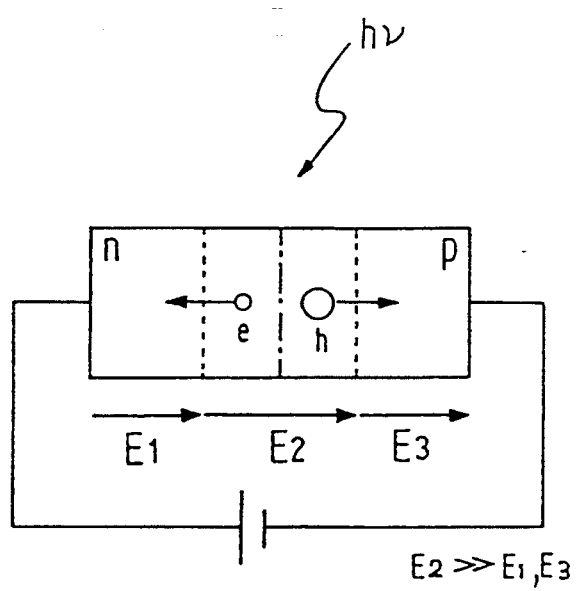
FIG. 2 is a diagram to explain a mechanism of generation of the optical beam induced current in p-n junction semiconductors biased in the reverse direction by a predetermined voltage.
Figure 3:
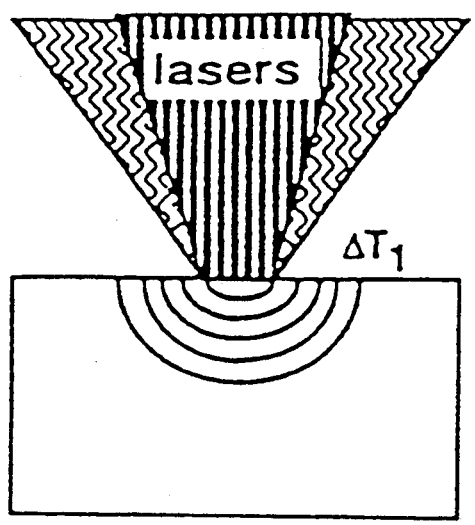
FIG. 3 is a diagram illustrative of a propagation of thermal waves from a laser spot into the inside of a void free metal.
Figure 4:
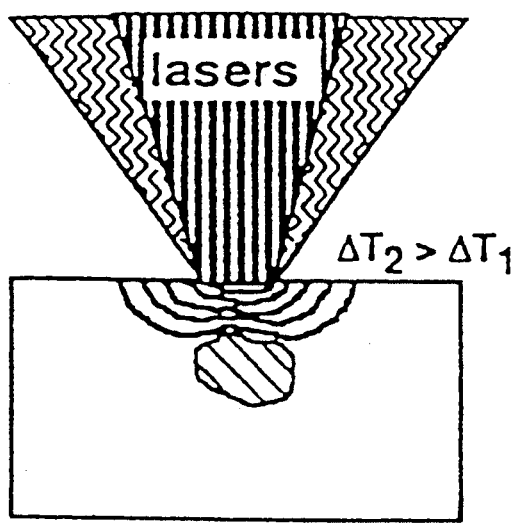
FIG. 4 is a diagram illustrative of an effect of a substance void on a propagation of thermal waves.
Figure 5:
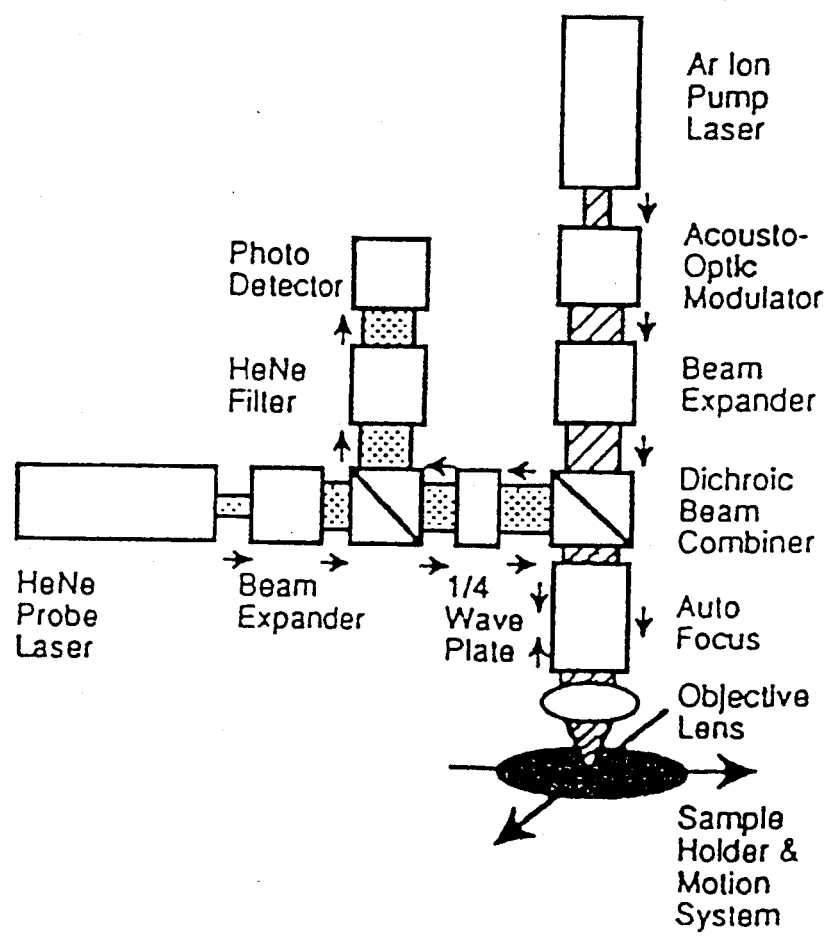
FIG. 5 is a schematic diagram of a thermal wave modulated optical reflectance imaging apparatus in the prior art.

The present invention provides a novel apparatus for detecting and measuring any void within metals. The invention also provides a novel apparatus for diagnosing interconnections of semiconductor integrated circuits, and more particularly provides a novel apparatus for detecting and measuring any voids within metals constituting interconnections of the semiconductor integrated circuits. The present invention also provides a method for diagnosing interconnections of the semiconductor integrated circuits and more particularly provides a method for detecting and measuring any voids within the metal constituting interconnections of the semiconductor integrated circuits.

The description will hereinafter be directed to a structural explanation of the apparatus for detecting and measuring any void within the metal constituting the interconnections of the semiconductor integrated circuits. An apparatus according to the present invention utilizes a sole laser device only, while the conventional apparatus for diagnosing the interconnections of the semiconductor integrated circuits utilized two laser devices such as the probe laser and pump laser devices. According to the present invention, the apparatus for detecting and measuring any void within a metal constituting interconnections of the semiconductor integrated circuits includes at least a sample holder section in which any sample for example semiconductor integrated circuits is secured, a laser section for irradiating a laser beam on a surface of the semiconductor integrated circuits, a power supply section for supplying a voltage to the semiconductor integrated circuits and a current variation detecting and measuring section for detecting and measuring any variation of electrical currents flowing through the interconnections of the semiconductor integrated circuits. According to the present invention, the sample holder section on which the sample semiconductor integrated circuit chip is mounted is secured during the scanning of the laser beam irradiation on the sample semiconductor integrated circuits. In contrast, the laser beam section may be designed to move in a plane to implement a high speed scanning of the laser beam irradiation on the sample semiconductor integrated circuit chip. During the scanning of the laser beam irradiation on the sample semiconductor integrated circuit chip, the voltage supply section may supply a predetermined voltage to the sample semiconductor integrated circuit chip so that an amount of an electrical current flows through the interconnections of the semiconductor integrated circuits. According to the present invention, the laser beam irradiated is implemented to provide a heat energy to part of metals on a beam spot in which the metals constitute the interconnections of the semiconductor integrated circuits. Commonly, it has been known in the art that the laser beam irradiation which may supply a heat on the beam spot of the metals constituting the interconnections has an ability to cause somewhat of rise of an electrical resistivity of a part of the metal under a beam spot which receives the heat by the lease beam irradiation. When the metal receives the laser beam irradiation or a heat on its beam spot, a thermal wave generated on the beam spot is radially propagated into the inside of the metals constituting the interconnections of the semiconductor integrated circuits. When the metals received any heat by the laser beam irradiation involves a void therein, the void may act to prevent the propagation of the thermal wave from the laser beam spot into the inside of the metal constituting the interconnections. Any prevention of the propagation of the thermal wave causes a heat accumulation around the void involved in a part of the metals which received the laser beam irradiation. Such heat accumulation around the void causes a rise of a temperature of a part of the metals adjacent to the void. Such rise of the temperature of the metal adjacent to the void leads to an extra rise of an electrical resistivity of the metal adjacent to the void. The extra rise of the electrical resistivity causes a reduction of the electrical current flowing around the void in the metals. The current variation detecting and measuring section is provided to detect and measure any variation of the electrical resistivity or a current reduction appearing around the void so as to sense a position of the void or the existence of the void.

Only when the laser beam irradiation focuses on a void involving part of the metals which involves a void, the current variation detecting and measuring section has an ability to sense a relatively great increase of the electrical resistivity or a relatively large current reduction appearing at a position adjacent to the void. When the laser beam irradiation focuses on a void free remaining part of the metals, the current variation detecting and measuring section is enable to sense such a relatively great increase of the electrical resistivity or such a relatively large current reduction. From the above description, it could readily be understood that the complete scanning of the laser beam irradiation to the entire part of the interconnections made of the metals results in a complete detection and measurement of a position and existence of any void involved within the metals constituting the interconnections of the semiconductor integrated circuits. Further, according to the present invention, the novel apparatus for detecting and measuring any void has such a simplified structure as described above. The novel apparatus according to the present invention requires only use of a sole laser device for supplying a heat to a part of the metals constituting the interconnections, while in the prior arts, the conventional apparatus requires a plurality of laser devices, for example, the pump laser device and the probe laser device.

According to the present invention, the novel apparatus for diagnosing the interconnections of the semiconductor integrated circuits may further include a temperature control section for controlling a temperature of the sampled semiconductor integrated circuit chip. As described above, an amount of the electrical current supplied from the voltage supply section flows through the interconnections of the semiconductor integrated circuits during the scanning of the laser beam irradiation on the entire part of the metals constituting the interconnections. It commonly appears that the electrical current flowing through the interconnections provides a heat to the semiconductor integrated circuits. This results in a rise of the temperature of the semiconductor integrated circuits. The detecting and measuring of the void within the metals constituting the interconnections of the semiconductor integrated circuits may detect the void by sensing a relatively large rise of the temperature of the metals around the void due to some heat accumulation around the void caused by the prevention of the thermal wave propagation., The rise of the temperature of the semiconductor integrated circuits due to the electrical current flowing through the interconnections supplied by the voltage supply section renders it difficult to realize a high sensitive detection the void and high sensitive measuring a position of the void. To combat this problem, the temperature control section may preferably be provided to control a temperature of the sampled semiconductor integrated circuit chip at a suitable temperature for realizing high sensitive detection and measuring of the voids.

Moreover, according to the present invention, the apparatus for diagnosing the interconnections of the semiconductor integrated circuits may optionally include a signal processing section, an image processing section and a system control section to confirm the existence and position of the void as a picture on a display such as a CRT.

Furthermore, according to the present invention, the laser device involved in the apparatus for diagnosing the interconnections of the semiconductor integrated circuits may optionally be provided with an additional wavelength control section for controlling a wavelength of a laser beam. The wavelength of the laser beam is associated with an energy of the laser beam which may provide a heat to the metals constituting the interconnections of the semiconductor integrated circuits. According to the present invention, the operation for detecting and measuring the void within the metals may be implemented by sensing a variation of amount of the electrical current due to a relatively large increase of the temperature of a part of the metals adjacent to the void. It may be preferable that the laser beam to be irradiated is so controlled as to have such a suitable wavelength as able to realize a possible high sensitivity in detecting and measuring operations of the void within the metals constituting the interconnections of the semiconductor integrated circuits.

Preferred embodiments of the present invention will hereinafter be described with reference to the accompanying drawings.

Figure 6:
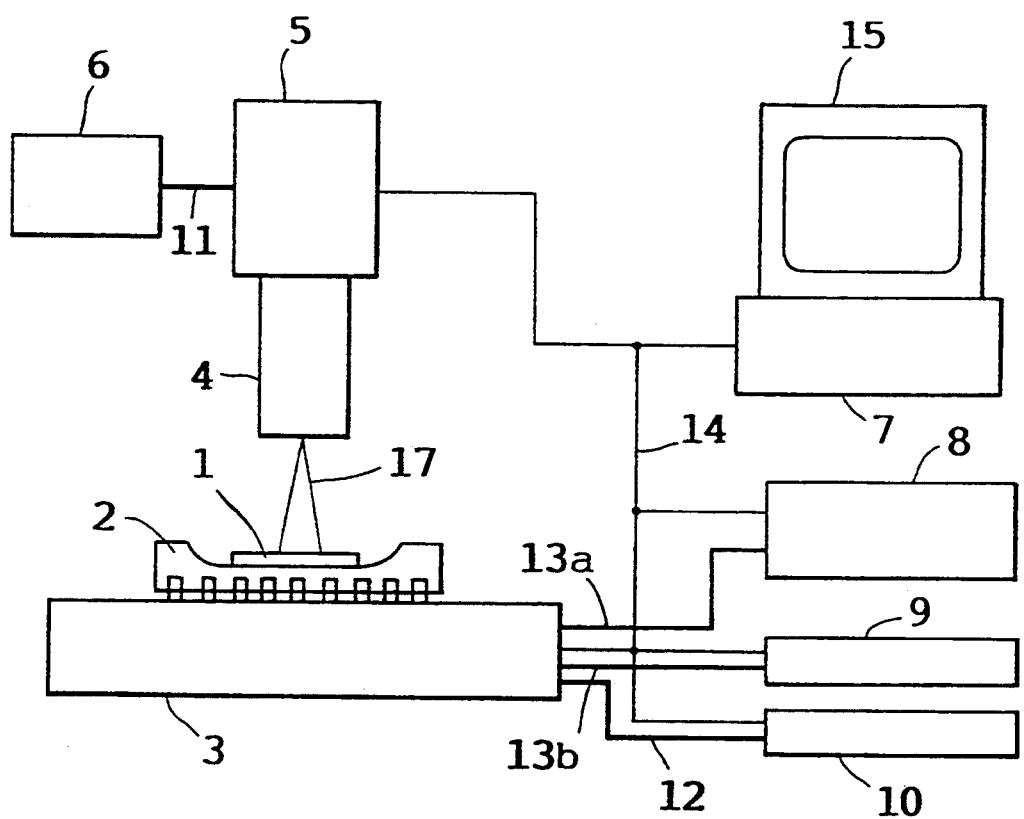
FIG. 6 is a diagram illustrative of a diagnosing apparatus for detecting and measuring any void within a metal constituting interconnections of a semiconductor integrated circuits in a first embodiment according to the present invention.

A first embodiment according to the present invention will be described with referring to FIG. 6 in which a novel apparatus for diagnosing interconnections of semiconductor integrated circuits is illustrated. The novel diagnosing apparatus according to the present invention has abilities to detect and measure the existence of any void and its position within a metal constituting the interconnections of the semiconductor integrated circuits.

The novel diagnosing apparatus according to the present invention has an extremely simplified structure as described below. The novel diagnosing apparatus may have a single laser beam generating section 6 for generating a laser beam having a predetermined wavelength suitable to realize a possible high sensitivity in detecting and measuring any void within the metal constituting the interconnections of the semiconductor integrated circuits. The laser beam generation section 6 is connected through an optical wave guide 11 to a laser beam scanning section 5 so that the laser beam generated by the laser beam generating section 6 is transmitted through the optical wave guide 11 to the laser beam scanning section 5. The laser beam section 5 is provided with a microscope section 4 so that the laser beam which has been transmitted to the laser beam scanning section 5 is further transmitted through the microscope section 4 for subsequent irradiation of a laser beam 17 on a sampled semiconductor integrated circuit chip. In detail, the laser beam 17 is irradiated on the metal constituting the interconnections of the semiconductor integrated circuits for implementation of detecting and measuring any void within the metal constituting the interconnections.

The sample semiconductor integrated circuits is packaged in a packaging 2 which is placed on a sample holder 3. The sample holder is designed to be secured in a predetermined position at least during the scanning operation of the laser beam irradiation on the sample semiconductor integrated circuits. In contrast, the laser beam scanning section 5 to which the microscope section 4 is secured may be moved in a plane to realize the complete scanning of the laser beam irradiation on the entire surface of the interconnections of the semiconductor integrated circuits 1.

The novel diagnosing apparatus according to the present invention further includes a voltage supply section 9 connected through a voltage supply line 13b to the sample holder 3 which is further electrically connected to pins of the package 2 on which the semiconductor integrated circuit chip 1 is packaged. The pins of the package is of course connected to the interconnections of the semiconductor integrated circuits. The voltage supply section 9 may supply a voltage to the semiconductor integrated circuits 1 through the voltage supply line 13b in order to allow that a desired amount of the electrical current flow through the interconnections of the semiconductor integrated circuits. An amount of the voltage to be supplied from the voltage supply section 9 to the semiconductor integrated circuits may be so controllable as to apply such a suitable amount of an electrical current flowing through the interconnections as to obtain a possible high sensitivity in detecting and measuring any void within the metals constituting the interconnections of the semiconductor integrated circuits.

The novel diagnosing apparatus according to the present invention further includes a current detecting section 8 which is electrically connected through an electrical current transmission line 13a to the sample holder 3 which is further electrically connected to the pins of the package 2 on which the semiconductor integrated circuit chip 1 is packaged. Any electrical current which flows through the interconnections of the semiconductor integrated circuits 1 may be transmitted through the pins of the package 2 and the electrical current transmission line 13a to the current detecting section 8. The current detecting section 8 has an ability to detect any variation of an amount of the electrical current which flows through the interconnections of the semiconductor integrated circuits 1. The current detection section 8 may optionally have an ability to amplify an amount of the variation of the electrical current which has been detected itself. The current detecting section may further have a function to enlarge the amount of the variation of the electrical current which has been detected itself to facilitate a high sensitive detection of any void within the metals constituting the interconnections of the semiconductor integrated circuits. Here it may be remembered that the irradiation of the laser beam 17 on a position of the metal constituting the interconnections at which a void exists causes a relatively large rise of a temperature of the position of the metal around the void so as to cause a relatively large increase of the electrical resistivity of the metal, providing a relatively large reduction of the amount of the current which may be detectable by the current detecting section 8. Notwithstanding, it may be preferable to amplify the detected current variation up to a suitable amount thereof for surly and correctly confirming that the current variation is due to the existence of the void within the metal.

Further more, the novel diagnosing apparatus according to the present invention may include a signal and imaging processing section 7 which includes a system control section. The signal and imaging processing section 7 with the system control section is connected through signal transmission lines 14 to the laser scanning section 5 so that the action of the laser scanning section 5 may be controlled by signals transmitted from the system control section through the signal transmission lines 14 thereby the scanning operation of the laser scanning section 5 is controlled. The signal and image processing section 7 with the system control section may further be connected through the signal transmission lines 14 to the current detecting section 8 so that any result of the detection of the current variation may be transmitted as signals from the current detecting signal 8 to the signal processing section 7. The signal and image processing section 7 with the system control section has an ability to convert the signals as to the result of the detection of the current variation into image signals which may be usable for displaying visible images as to the interconnections and any void involved therein. The signal and image processing section 7 with the system control section may be connected to a display device such as a CRT 15 which may have an ability to display any visible picture connected with the interconnections and voids involved therein.

The signal and image processing section 7 is furthermore connected through the signal transmission lines 14 to the voltage supply section 9 so that the voltage supply section may control a voltage to be supplied to the interconnections of the integrated circuits according to signals which have been transmitted from the system control section accompanied to the signal and image processing section 7. The control of the amount of the voltage to be supplied by the voltage supply section 9 may be made to obtain a possible high sensitivity in detecting and measuring any void within the metal constituting the interconnections of the integrated circuits. The signal and image processing section 7 with the system control section may moreover be connected through the signal transmission lines 14 and the sample holder 3 to the pins of the package 2 on which the integrated circuit chip 1 is mounted.

Additionally, the novel diagnosing apparatus according to the present invention may optionally include a temperature control section 10 which is connected through a thermal conduction line and the sample holder 3 to the package 2 of the integrated circuits 1 so that any extra heat may be conducted through the thermal conduction line 12 to the temperature control section 10. The temperature control section 10 has an ability to control and maintain the temperature of the integrated circuits 1 at such a suitable temperature as to permit a possible high sensitivity in detecting and measuring any void within the metals constituting the interconnections of the integrated circuits 1. The control of the temperature of the metal constituting the interconnections of the integrated circuits 1 at least during the scanning operation of the laser beam irradiation is critically important for obtaining a possible high sensitivity in detecting and measuring any void with the metals since the sensitivity in detecting and measuring operations may greatly be affected by the temperature of the metals constituting the interconnections. The temperature control section 10 is also electrically connected to the signal and image processing section 7 with the system control section through the signal transmission lines 14. The temperature control section 10 may transmit thermal informations as to the interconnections of the integrated circuits to the signal and imaging processing section 7 with the system control section. According to the signals as the thermal informations fetched from the temperature control section 10, the system control section may control each of the sections. The temperature control section 10 may further fetch signals concerned with a desirable temperature of the interconnections of the integrated circuits 1 for controlling the temperature of the metals constituting the interconnections through the thermal conduction line 12. Such temperature control by the temperature control section 10 through the thermal conduction line 12 is maintained at least during the diagnosing operation of the novel diagnosing apparatus to realize a possible high sensitivity in detecting and measuring any void within the metals constituting the interconnections of the integrated circuits 1.

The integrated circuits 1 may be maintained to have a suitable temperature for realizing a possible high sensitivity in detecting and sensing operations by the temperature control section 10 in cooperation with the system control section during the diagnosing operation by the diagnosing apparatus. The high speed scanning operation of the laser beam irradiation on the entire surface of the interconnections of the integrated circuits 1 is accomplished by the laser beam scanning section 5 in cooperation with the system control section. Any electrical current variation due to the existence of the void is detectable by the current detecting section 8 which may have the amplification function. When the laser beam 17 is irradiated on a beam spot under which a void exists, the reduction of the electrical current is detected by the current detecting section 8. Informations as to the amount of the electrical current which has been detected by the current detecting section 8 may be transmitted through the signal transmission line 14 to the signal and image processing section 7 connected to the display device such as the CRT device 15 on which any image or a visible picture as to both the interconnections and any void involved therein may be displayed. The display device may display the image and the visible picture with differences in luminous intensity which may be proportional to the amount of the electrical current which had been detected by the current detecting section 8. The existence of the void may represent by a dark point in the image or the visible picture on the display device such as the CRT 15 since the existence of the void within the metals constituting the interconnections may render the electrical current flowing through the interconnections be reduced.

During the scanning operation of the laser beam irradiation on the interconnections of the semiconductor integrated circuits, the voltage supply section 9 may apply a suitable voltage for realizing a possible high sensitivity in detecting and measuring operations for the existence of the voids as well as the temperature control section 10 may also control and maintain the temperature of the interconnections at a suitable temperature for realizing a possible high sensitivity therein.

The novel diagnosing apparatus employing only the single laser device 6 has an ability to implement an extremely high speed scanning operation. Although in the prior art a necessary time for obtaining the complete image or the visible picture being displayed on the display device was six minutes, the novel diagnosing apparatus in the first embodiment according to the present invention has an excellent ability to implement an extremely high speed scanning operation and data processing operation in which a necessary time for obtaining the complete images or the visible pictures would be 0.5 seconds. By contrast to the inventor's admitted prior art, a time for obtaining the images or the visible pictures being displayed on the display device in the first embodiment according to the present invention is considerably shortened by a ratio of 1/7200.

The above structural simplification of the novel diagnosing apparatus may permit the apparatus to be free from such disadvantages as the costly and time-consuming conventional diagnosing apparatus.

A second embodiment according to the present invention will be described with referring FIG. 7 in which a novel apparatus for diagnosing interconnections of semiconductor integrated circuits is illustrated. The novel diagnosing apparatus according to the present invention has abilities to detect and measure the existence of any void and its position within a metal constituting the interconnections of the semiconductor integrated circuits.

The novel diagnosing apparatus according to the present invention also has an extremely simplified structure as described below but being modified from the structure of that of the first embodiment according to the present invention. In the second embodiment according to the present invention, the novel diagnosing apparatus for diagnosing the interconnections of the integrated circuits has the same structure as that of the first embodiment according to the present invention, but for providing a LSI tester which is provided to supply a voltage to the interconnections of the integrated circuits during the detecting and measuring operations of any void within the metals constituting the interconnections. The LSI tester also has an ability to supply signals to permit a necessary electrical current for diagnosis to flow through a particular interconnection in any sense in which, if such LSI tester is not provided, the particular interconnection commonly had objected any application of electrical current except in the exceptional state. The novel diagnosing apparatus of the second embodiment according to the present invention would not require such the voltage supply section as provided in the first embodiment according to the present invention since the LSI tester may satisfy the roll of supplying the voltage to the interconnections of the integrated circuits.

The novel diagnosing apparatus may have a single laser beam generating section for generating a laser beam having a predetermined wavelength suitable to realize a possible high sensitivity in detecting and measuring any void within the metal constituting the interconnections of the semiconductor integrated circuits. The laser beam generation section is connected through a optical wave guide to a laser beam scanning section so that the laser beam generated by the laser beam generating section is transmitted through the optical wave guide to the laser beam scanning section. The laser beam section is provided with a microscope section so that the laser beam which has been transmitted to the laser beam scanning section is further transmitted through the microscope section for subsequent irradiation of a laser beam 17 on a sampled semiconductor integrated circuit chip. In detail, the laser beam 17 is irradiated on the metal constituting the interconnections of the semiconductor integrated circuits for implementation of detecting and measuring any void within the metal constituting the interconnections.

The sample semiconductor integrated circuits 1 is packaged in a packaging 2 which is placed on a sample holder 3. The sample holder is designed to be secured in a predetermined position at least during the scanning operation of the laser beam irradiation on the sample semiconductor integrated circuits. In contrast, the laser beam scanning section to which the microscope section is secured may be moved in a plane to realize the complete scanning of the laser beam irradiation on the entire surface of the interconnections of the semiconductor integrated circuits 1.

Contrary to the first embodiment according to the present invention, the novel diagnosing apparatus of the second embodiment further includes a LSI tester 16 connected through voltage supply lines 18 to pins of the package 2 on which the semiconductor integrated circuit chip 1 is packaged. The LSI tester has an ability to permit that a necessary electrical current for diagnosis flow through a particular interconnection in any state in which, if such LSI tester is not provided, the particular interconnection commonly had objected any application of electrical current except in the exceptional state. The necessary voltage supply by the LSI tester to such a particular interconnection is possible by supplying signals by the LSI tester to the integrated circuits 1. The above mentioned function of the LSI tester may permit the exact diagnosis of any interconnection which may be involved in any type of integrated circuits.

The LSI tester 16 may also perform a roll to supply a voltage to the semiconductor integrated circuits 1 through the voltage supply lines 18 in order to allow that a desired amount of the electrical current flow through the interconnections of the semiconductor integrated circuits 1. An amount of the voltage to be supplied from the LSI tester 16 to the semiconductor integrated circuits 1 may be so controllable as to apply such a suitable amount of an electrical current flowing through the interconnections as to obtain a possible high sensitivity in detecting and measuring any void within the metals constituting the interconnections of the semiconductor integrated circuits.

The novel diagnosing apparatus according to the present invention further includes a current detecting section 8 which is electrically connected through an electrical current transmission line 13a to the package 2 on which the semiconductor integrated circuit chip 1 is packaged. Any electrical current which flows through the interconnections of the semiconductor integrated circuits 1 may be transmitted through the pins of the package 2 and the electrical current transmission line 13a to the current detecting section 8. The current detecting section 8 has an ability to detect any variation of an amount of the electrical current which flows through the interconnections of the semiconductor integrated circuits 1. The current detecting section 8 may optionally have an ability to amplify an amount of the variation of the electrical current which ash been detected itself. The current detecting section 8 may further have a function to enlarge the amount of the variation of the electrical current which has been detected itself to facilitate a high sensitive detection of any void within the metals constituting the interconnections of the semiconductor integrated circuits.

Further more, the novel diagnosing apparatus according to the present invention may include a signal and imaging processing section with a system control section, both of which are not illustrated. The signal and imaging processing section with the system control section is connected through signal transmission lines to the laser scanning section so that the action of the laser scanning section may be controlled by signals transmitted from the system control section through the signal transmission lines thereby the scanning operation of the laser scanning section is controlled. The signal and image processing section with the system control section may further be connected through the signal transmission lines to the current detecting section 8 so that any result of the detection of the current variation may be transmitted as signals from the current detecting section 8 to the signal processing section. The signal and image processing section with the system control section has an ability to convert the signals as to the result of the detection of the current variation into image signals which may be usable for displaying visible images as to the interconnections and any void involved therein. The signal and image processing section with the system control section may be connected to a display device such as a CRT 15 which may have an ability to display any visible picture concerned with the interconnections and voids involved therein as illustrated in FIG. 7.

The signal and image processing section is furthermore connected through the signal transmission lines to the LSI tester 16 so that the voltage supply section may control voltage to be supplied to the interconnections of the integrated circuits according to signals which have been transmitted from the system control section accompanied to the signal and image processing section. The control of the amount of the voltage to be supplied by the LSI tester 16 may be made to obtain a possible high sensitivity in detecting and measuring any void within the metal constituting the interconnections of the integrated circuits. The signal and image processing section with the system control section may moreover be connected through the signal transmission lines to the pins of the package 2 on which the integrated circuit chip 1 is mounted.

Figure 7:
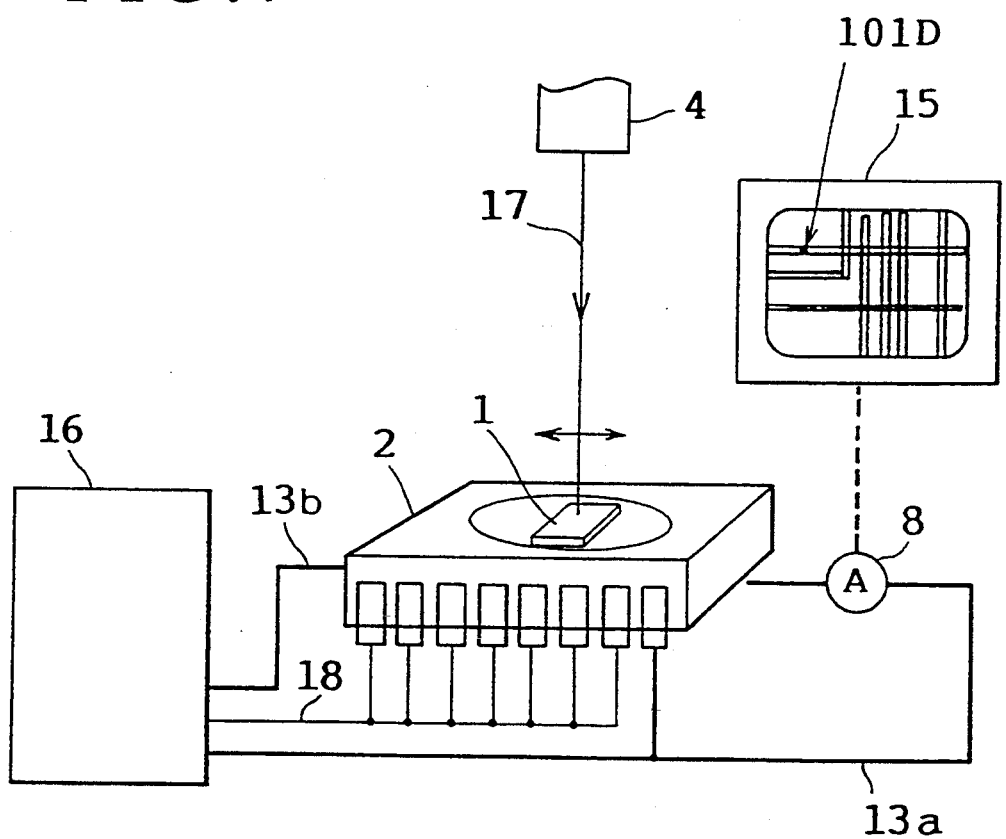
FIG. 7 is a diagram illustrative of a diagnosing apparatus for detecting and measuring any void within a metal constituting interconnections of a semiconductor integrated circuits in a second embodiment according to the present invention.

Additionally, the novel diagnosing apparatus according to the present invention may optionally include a temperature control section not illustrated in FIG. 7 which is connected through a thermal conduction line not illustrated in FIG. 7 to the package 2 of the integrated circuits 1 so that any extra heat may be conducted through the thermal conduction line to the temperature control section. The temperature control section has an ability to control and maintain the temperature of the integrated circuits 1 at such a suitable temperature as to permit a possible high sensitivity in detecting and measuring any void within the metals constituting the interconnections of the integrated circuits 1. The control of the temperature of the metal constituting the interconnections of the integrated circuits 1 at least during the scanning operation of the laser beam irradiation is critically important for obtaining a possible high sensitivity in detecting and measuring any void within the metals since the sensitivity in detecting and measuring operations may greatly be affected by the temperature of the metals constituting the interconnections. The temperature control section is also electrically connected to the signal and image processing section with the system control section through the signal transmission lines. The temperature control section may transmit thermal informations as to the interconnections of the integrated circuits to the signal and image processing section with the system control section. According to the signals as the thermal informations fetched from the temperature control section, the system control section may control each of the sections. The temperature control section 10 may further fetch signals concerned with a desirable temperature of the interconnections of the integrated circuits 1 for controlling the temperature of the metals constituting the interconnections through the thermal conduction line. Such temperature control by the temperature control section through the thermal conduction line is maintained at least during the diagnosing operation of the novel diagnosing apparatus to realize a possible high sensitivity in detecting and measuring any void within the metals constituting the interconnections of the integrated circuits 1.

The integrated circuits 1 may be maintained to have a suitable temperature for realizing a possible high sensitivity in detecting and sensing operations by the temperature control section in cooperation with the system control section during the diagnosing operation by the diagnosing apparatus. The high speed scanning operation of the laser beam irradiation on the entire surface of the interconnections of the integrated circuits 1 is accomplished by the laser beam scanning section in cooperation with the system control section. Any electrical current variation due to the existence of the void is detectable by the current detecting section 8 which may have the amplification function. When the laser beam 17 is irradiated on a beam spot under which a void exists, the reduction of the electrical current is detected by the current detecting section 8. Informations as to the amount of the electrical current which has been detected by the current detecting section 8 may be transmitted through the signal transmission line to the signal and image processing section 7 connected to the display device such as the CRT device 15 on which any image or a visible picture as to both the interconnections and any void involved therein may be displayed. The display device may display the image and the visible picture with differences in luminous intensity which may be proportional to the amount of the electrical current which had been detected by the current detecting section 8. The existence of the void may represent by a dark point in the image or the visible picture on the display device such as the CRT 15 since the existence of the void within the metals constituting the interconnections may render the electrical current flowing through the interconnections be reduced.

As described above, the LSI tester 16 has an ability to permit that a necessary electrical current for diagnosis operation flow through a particular interconnection in any state in which, if such a LSI tester is not provided, the particular interconnection commonly had objected any application of electrical current, except in the exceptional state. The necessary voltage supply by the LSI tester to such a particular interconnection is possible by supplying signals from the LSI tester to the integrated circuits 1. The above mentioned function of the LSI tester may permit the exact diagnosis of any interconnection which may be involved in any type of integrated circuits.

During the scanning operation of the laser beam irradiation on the interconnections of the semiconductor integrated circuits, the LSI tester 16 may apply a suitable voltage for realizing a possible high sensitivity in detecting and measuring operations for the existence of the voids as well as the temperature control section may also control and maintain the temperature of the interconnections at a suitable temperature for realizing a possible high sensitivity therein.

The novel diagnosing apparatus employing only the single laser device has an ability to implement an extremely high speed scanning operation. Although in the prior art a necessary time for obtaining the complete image or the visible picture being displayed on the display device was six minutes, the novel diagnosing apparatus in the second embodiment according the present invention has an excellent ability to implement an extremely highly speed scanning operation and data processing operation in which a necessary time for obtaining the complete images or the visible pictures would be 0.5 seconds. By contrast to the inventor's admitted prior art, a time for obtaining the images or the visible pictures being displayed on the display device in the first embodiment according to the present invention is considerably shortened by a ratio of 1/7200.

The above structural simplification of the novel diagnosing apparatus may permit the apparatus to be free from such disadvantages as the costly and time-consuming conventional diagnosing apparatus.

Figure 8:
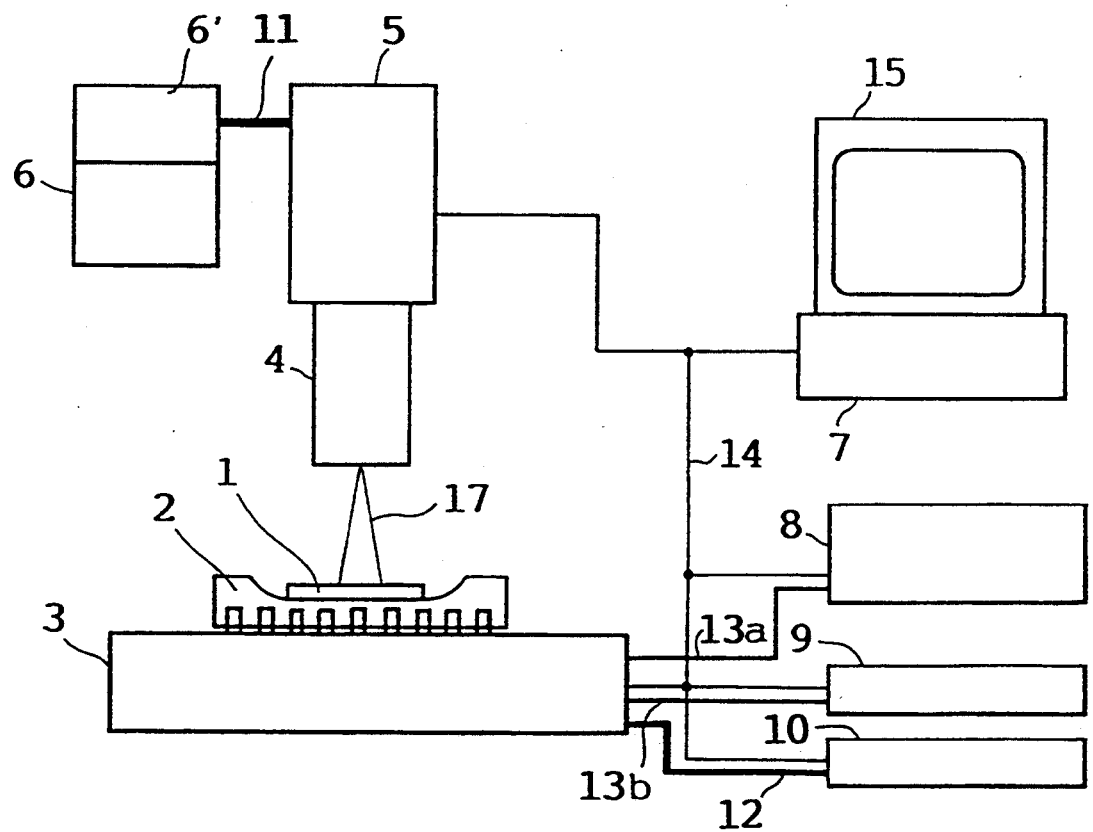
FIG. 8 is a diagram illustrative of a diagnosing apparatus for detecting and measuring any void within a metal constituting interconnections of a semiconductor integrated circuits in a third embodiment according to the present invention.

A third embodiment according to the present invention will be described with referring FIG. 8 in which a novel apparatus for diagnosing interconnections of semiconductor integrated circuits is illustrated. The novel diagnosing apparatus according to the present invention has abilities to detect and measure the existence of any void and its position within a metal constituting the interconnections of the semiconductor integrated circuits.

The novel diagnosing apparatus of the third embodiment according to the present invention has an extremely simplified structure as described below. The structure of the novel diagnosing apparatus of the third embodiment according to the present invention is the same as that of the first embodiment, except in view of providing a laser beam wavelength control section 6' which has an ability to control a wavelength of the laser beam generated by a laser beam generation section 6. The laser beam wavelength control section 6' may control the wavelength of the laser beam generated by the laser beam generation section 6 so that the laser beam to be irradiated on sample integrated circuits has a suitable wavelength.

The interconnections of the integrated circuits may be made of electrically-conductive materials such as aluminum, various types of silicide, polysilicon and polysides and otherwise. Here it would be assumed that the interconnection is made of a kind of such conductive materials, which is able to facilitate causing the optical beam induced current by irradiating a laser beam having such a suitable wavelength as to cause the optical beam induced current. In this case, the laser beam irradiation may cause an increase of the amount of the electrical current due to the generation of the optical beam induced current. By contrast, when the laser beam having such a wavelength as able to cause the optical beam induced current is irradiated on a beam spot under which a void existed, the electrical current to be detected by the current detecting section is reduced due to the increase of the temperature around the void involved in the conductive material constituting the interconnections. In which case, such a current reduction to be detected by the current detecting section due to the rise of the temperature around the void may be compensated by the increase of the electrical current due to the optical beam induced current thereby almost no variation of the electrical current may be detected by the current detecting section. So it would be difficult to distinguish the existence of any void within the conductive material constituting the interconnections of the integrated circuits.

To accomplish the exact and correct detection operation of any void within any conductive material usable for the interconnections of the integrated circuits, the laser beam wavelength control section 6' keeps the wavelength be at least longer than a critical wavelength at which the optical beam induced current is generated. Therefore, such an irradiation of the laser beam having a wavelength being longer than the critical wavelength of the generation of the optical beam induced current may present any optical beam induced current to be caused so that any electrical current variation to be detected by the current detecting section would appear only due to the rise of the temperature of the conductive material around the void. As a result, the current detecting section is able to detect the variation of the electrical current due to the temperature rise appearing around the void involved in the conductive material constituting the interconnections of the integrated circuits without any interference by the optical beam induced current. This may permit the exact and correct detecting operation of any void within any conductive material being usable for the interconnections of the semiconductor integrated circuits.

The novel diagnosing apparatus has a single laser beam generating section 6 for generating a laser beam having a predetermined wavelength. The laser beam generation section 6 is connected to the laser beam wavelength control section 6' in which a wavelength of the laser beam generated by the generation section 6 may be controlled as described above. The laser beam wavelength control section 6' is connected through an optical wave guide 11 to a laser beam scanning section 5 so that the laser beam having the controlled wavelength is transmitted through the optical wave guide 11 to the laser beam scanning section 5. The laser beam scanning section 5 is provided with a microscope section 4 so that the laser beam which has been transmitted to the laser beam scanning section 5 is further transmitted through the microscope section 4 for subsequent irradiation of a laser beam 17 on a sampled semiconductor integrated circuit chip 1.

The sample semiconductor integrated circuits is packaged in a packaging 2 which is placed on a sample holder 3. The sample holder is designed to be secured in a predetermined position at least during the scanning operation of the laser beam irradiation on the sample semiconductor integrated circuits. In contrast, the laser beam scanning section 5 to which the microscope section 4 is secured may be moved in a plane to realize the complete scanning of the laser beam irradiation on the entire surface of the interconnections of the semiconductor integrated circuits 1.

The novel diagnosing apparatus further includes a voltage supply section 9 connected through a voltage supply line 13b to the sample holder 3 which is further electrically connected to pins of the package 2 on which the semiconductor integrated circuit chip 1 is packaged. The pins of the package is of course connected to the interconnections of the semiconductor integrated circuits. The voltage supply section 9 may supply a voltage to the semiconductor integrated circuits 1 through the voltage supply line 13b. An amount of the voltage to be supplied from the voltage supply section 9 to the semiconductor integrated circuits 1 may be so controllable as to apply such a suitable amount of an electrical current flowing through the interconnections as to obtain a possible high sensitivity in detecting and measuring any void within the conductive materials constituting the interconnections of the semiconductor integrated circuits.

The novel diagnosing apparatus further includes a current detection section 8 which is electrically connected through an electrical current transmission line 13a to the sample holder 3 which is further electrically connected to the pins of the package 2. Any electrical current which flows through the interconnections of the semiconductor integrated circuits 1 may be transmitted through the pins of the package 2 and the electrical current transmission line 13a to the current detecting section 8. The current detecting section 8 has an ability to detect any variation of an amount of the electrical current which flows through the interconnections of the semiconductor integrated circuits 1. The current detecting section 8 may optionally have an ability to amplify an amount of the variation of the electrical current which has been detected itself. The current detecting section may further have a function to enlarge the amount of the variation of the electrical current which has been detected itself to facilitate a high sensitive detection of any void within the conductive materials constituting the interconnections of the semiconductor integrated circuits.

Still further, the novel diagnosing apparatus may include a signal and image processing section 7 which includes a system control section. The signal and imaging processing section 7 with the system control section is connected through signal transmission lines 14 to the laser scanning section 5 so that the action of the laser scanning section 5 may be controlled by signals transmitted from the system control section through the signal transmission lines 14 thereby the scanning operation of the laser scanning section 5 is controlled. The signal and image processing section 7 with the system control section may be connected through the signal transmission lines 14 to the current detecting section 8 so that any result of the detection of the current variation may be transmitted as signals from the current detection section 8 to the signal processing section 7. The signal and image processing section 7 with the system control section has an ability to convert the signals as to the result of the detection of the current variation into image signals which may be usable for displaying visible images as to the interconnections and any void involved therein. The signal and image processing section 7 with the system control section may be connected to a display device such as a CRT 15 which may have an ability to display any visible picture concerned with the interconnections and voids involved therein.

The signal and image processing section 7 is connected through the signal transmission lines 14 to the voltage supply section 9 so that the voltage supply section may control a voltage to be supplied to the interconnections of the integrated circuits according to signals which have been transmitted from the system control section accompanied to the signal and image processing section 7. The control of the amount of the voltage to be supplied by the voltage supply section 9 may be made to obtain a possible high sensitivity in detecting and measuring any void within the conductive material constituting the interconnections of the integrated circuits. The signal and image processing section 7 with the system control section may be connected through the signal transmission lines 14 and the sample holder 3 to the pins of the package 2 on which the integrated circuit chip 1 is mounted.

The novel diagnosing apparatus may optionally include a temperature control section 10 which is connected through a thermal conduction line and the sample holder 3 to the package 2 of the integrated circuits 1 so that any extra heat may be conducted through the thermal conduction line 12 to the temperature control section 10. The temperature control section 10 has an ability to control and maintain the temperature of the integrated circuits 1 at such a suitable temperature as to permit a possible high sensitivity in detecting and measuring any void within the conductive materials constituting the interconnections of the integrated circuits 1. The control of the temperature of the conductive material constituting the interconnections of the integrated circuits 1 at least during the scanning operation of the laser beam irradiation is critically important for obtaining a possible high sensitivity in detecting and measuring any void with the conductive materials since the sensitivity in detecting and measuring operations may greatly be affected by the temperature of the conductive materials constituting the interconnections. The temperature control section 10 is also electrically connected to the signal and image processing section 7 with the system control section through the signal transmission lines 14. The temperature control section 10 may transmit thermal informations as to the interconnections of the integrated circuits to the signal and imaging processing section 7 with the system control section. According to the signals as the thermal informations fetched from the temperature control section 10, the system control section may control each of the sections. The temperature control section 10 may fetch signals concerned with a desirable temperature of the interconnections of the integrated circuits 1 for controlling the temperature of the conductive materials constituting the interconnections through the thermal conduction line 12. Such temperature control by the temperature control section 10 through the thermal conduction line 12 may be continued at least during the diagnosing operation to realize a possible high sensitivity in detecting and measuring any void within the conductive materials constituting the interconnections of the integrated circuits.

The integrated circuits 1 may be maintained to have a suitable temperature for realizing a possible high sensitivity in detecting and sensing operations by the temperature control section 10 in cooperation with the system control section during the diagnosing operation by the diagnosing apparatus. The high speed scanning operation of the laser beam irradiation on the entire surface of the interconnections of the integrated circuits 1 is accomplished by the laser beam scanning section 5 in cooperation with the system control section. Any electrical current variation due to the existence of the void is detectable by the current detection section 8 which may have the amplification function. When the laser beam 17 is irradiated on a beam spot under which a void exists, the reduction of the electrical current is detected by the current detecting section 8. Informations as to the amount of the electrical current which has been detected by the current detecting section 8 may be transmitted through the signal transmission line 14 to the signal and image processing section 7 connected to the display device such as the CRT device 15 on which any image or a visible picture as to both the interconnections and any void involved therein may be displayed. The display device may display the image and the visible picture with differences in luminous intensity which may be proportional to the amount of the electrical current which had been detected by the current detecting section 8. The existence of the void may represent by a dark point in the image or the visible picture on the display device such as the CRT 15 since the existence of the void within the conductive materials constituting the interconnections may render the electrical current flowing through the interconnections be reduced.

A further embodiment according to the present invention will be described with referring FIG. 9 in which a novel apparatus for diagnosing interconnections of semiconductor integrated circuits is illustrated. The novel diagnosing apparatus according to the present invention has abilities to detect and measure the existence of any void and its position within the conductive material constituting the interconnections of the semiconductor integrated circuits.

The novel diagnosing apparatus according to the present invention also has an extremely simplified structure as described below, but being modified from the structure of that of the third embodiment according to the present invention. In the fourth embodiment, the novel diagnosing apparatus for diagnosing the interconnections of the integrated circuits has the same structure as that of the third embodiment according to the present invention, but for providing a LSI tester which is provided to supply a voltage to the interconnections of the integrated circuits during the detecting and measuring operations of any void within the conductive materials constituting the interconnections. The LSI tester also has an ability to supply signals to permit a necessary electrical current for diagnosis to flow through a particular interconnection in any state in which, if such LSI tester is not provided, the particular interconnection commonly had objected any application of electrical current except in the exceptional state. The novel diagnosing apparatus of the fourth embodiment would not require such the voltage supply section as provided in the third embodiment since the LSI tester may satisfy the roll of supplying the voltage to the interconnections of the integrated circuits.

The novel diagnosing apparatus may have a single laser beam generating section for generating a laser beam having a predetermined wavelength. The laser beam generation section is connected to the laser beam wavelength control section in which a wavelength of the laser beam generated by the generation section may be controlled as described above. The laser beam wavelength control section is connected through an optical wave guide to a laser beam scanning section so that the laser beam having the controlled wavelength is transmitted through the optical wave guide to the laser beam scanning section. The laser beam section is provided with a microscope section so that the laser beam which has been transmitted to the laser beam scanning section is further transmitted through the microscope section for subsequent irradiation of a laser beam 17 on a sampled semiconductor integrated circuit chip. In detail, the laser beam 17 is irradiated on the conductive material constituting the interconnections of the semiconductor integrated circuits for implementation of detecting and measuring any void within the conductive material constituting the interconnections.

The sample semiconductor integrated circuits 1 is packaged in a packaging 2 which is placed on a sample holder 3. The sample holder is designed to be secured in a predetermined position at least during the scanning operation of the laser beam irradiation on the sample semiconductor integrated circuits. In contrast, the laser beam scanning section to which the microscope section is secured may be moved in a plane to realize the complete scanning of the laser beam irradiation on the entire surface of the interconnections of the semiconductor integrated circuits 1.

Contrary to the third embodiment according to the present invention, the novel diagnosing apparatus of the second embodiment further includes a LSI tester 16 connected through voltage supply lines 18 to pins of the package 2 on which the semiconductor integrated circuit chip 1 is packaged. The LSI tester has an ability to permit that a necessary electrical current for diagnosis to flow through a particular interconnection in any state in which, if such LSI tester is not provided, the particular interconnection commonly had objected any application of electrical current except in the exceptional state. The necessary voltage supply by the LSI tester to such a particular interconnection in possible by supplying signals by the LSI tester to the integrated circuits 1. The above mentioned function of the LSI tester may permit the exact diagnosis of any interconnection which may be involved in any type of integrated circuits.

The LSI tester 16 may also perform a roll to supply a voltage to the semiconductor integrated circuits 1 through the voltage supply lines 18 in order to allow that a desired amount of the electrical current flow through the interconnections of the semiconductor integrated circuits 1. Am amount of voltage to be supplied from the LSI tester 16 to the semiconductor integrated circuits 1 may be so controllable as to apply such a suitable amount of an electrical current flowing through the interconnections as to obtain a possible high sensitivity in detecting and measuring any void within the conductive materials constituting the interconnections of the semiconductor integrated circuits.

The novel diagnosing apparatus according to the present invention further includes a current detecting section 8 which is electrically connected through an electrical current transmission line 13a to the package 2 on which the semiconductor integrated circuit chip 1 is packaged. Any electrical current which flows through the interconnections of the semiconductor integrated circuits 1 may be transmitted through the pins of the package 2 and the electrical current transmission line 13a to the current detecting section 8. The current detecting section 8 has an ability to detect any variation of an amount of the electrical current which flows through the interconnections of the semiconductor integrated circuits 1. The current detecting section 8 may optionally have an ability to amplify an amount of the variation of the electrical current which has been detected itself. The current detecting section 8 may further have a function to enlarge the amount of the variation of the electrical current which has been detected itself to facilitate a high sensitive detection of any void within the conductive materials constituting the interconnections of the semiconductor integrated circuits.

The novel diagnosing apparatus may include a signal and imaging processing section with a system control section, both of which are not illustrated. The signal and imaging processing section with the system control section is connected through signal transmission lines to the laser scanning section so that the action of the laser scanning section may be controlled by signals transmitted from the system control section through the signal transmission lines thereby the scanning operation of the laser scanning section is controlled. The signal and image processing section with the system control section may further be connected through the signal transmission lines to the current detecting section 8 so that any result of the detection of the current variation may be transmitted as signals from the current detecting section 8 to the signal processing section. The signal and image processing section with the system control section has an ability to convert the signals as to the result of the detection of the current variation into image signals which may be usable for displaying visible images as to the interconnections and any void involved therein. The signal and image processing section with the system control section may be connected to a display device such as a CRT 15 which may have an ability to display any visible picture concerned with the interconnections and voids involved therein as illustrated in FIG. 9.

The signal and image processing section is furthermore connected through the signal transmission lines to the LSI tester 16 to that the voltage supply section may control a voltage to be supplied to the interconnections of the integrated circuits according to signals which have been transmitted from the system control section accompanied to the signal and image processing section. The control of the amount of the voltage to be supplied by the LSI tester 16 may be made to obtain a possible high sensitivity in detecting and measuring any void within the conductive material constituting the interconnections of the integrated circuits. The signal and image processing section with the system control section may moreover be connected through the signal transmission lines to the pins of the package 2 on which the integrated circuit chip 1 is mounted.

Figure 9:
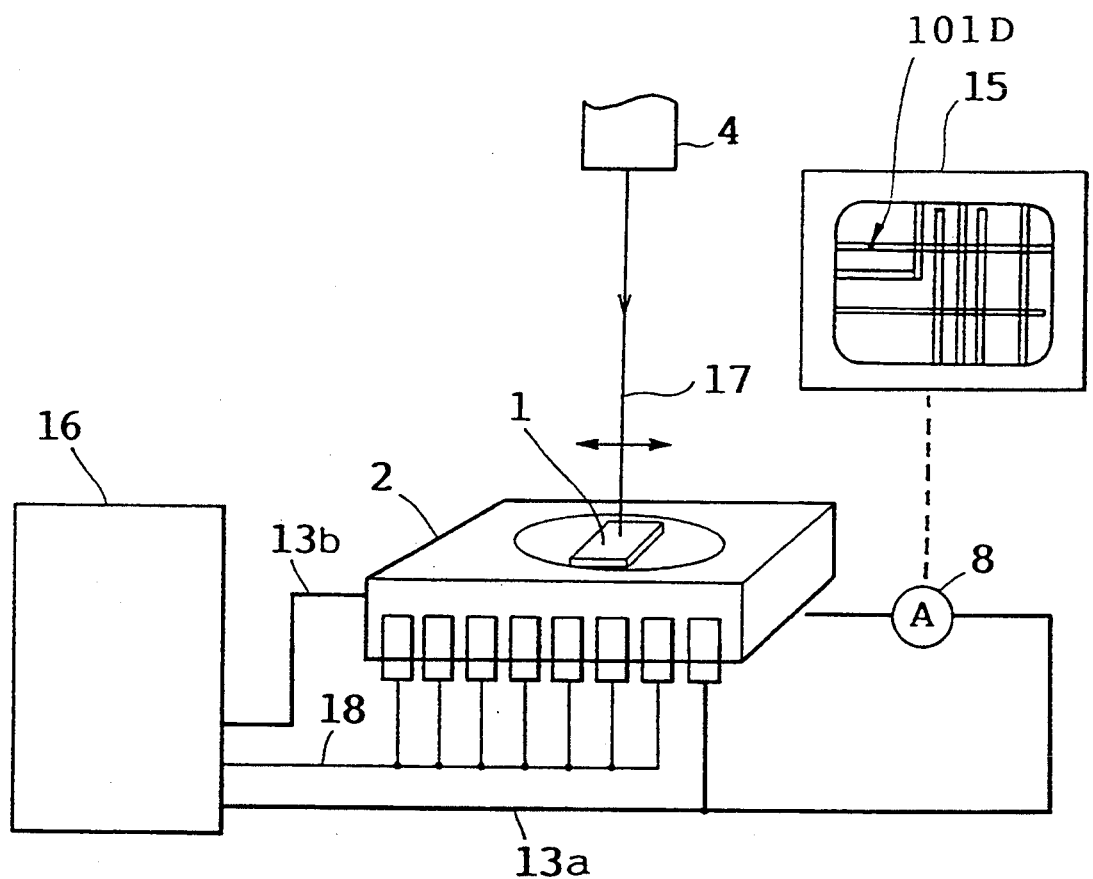
FIG. 9 is a diagram illustrative of a diagnosing apparatus for detecting and measuring any void within a metal constituting interconnections of a semiconductor integrated circuits in a fourth embodiment according to the present invention.

The novel diagnosing apparatus according to the present invention may optionally include a temperature control section not illustrated in FIG. 9 which is connected through a thermal conduction line not illustrated in FIG. 9 to the package 2 of the integrated circuits 1 so that any extra heat may be conducted through the thermal conduction line to the temperature control section. The temperature control section has an ability to control and maintain the temperature of the integrated circuits 1 at such a suitable temperature as to permit a possible high sensitivity in detecting and measuring any void within the conductive materials constituting the interconnections of the integrated circuits 1. The control of the temperature of the conductive material constituting the interconnections of the integrated circuits 1 at least during the scanning operation of the laser beam irradiation is critically important for obtaining a possible high sensitivity in detecting and measuring any void within the conductive materials since the sensitivity in detecting and measuring operations may greatly be affected by the temperature of the conductive materials constituting the interconnections. The temperature control section is also electrically connected to the signal and image processing section with the system control section through the signal transmission lines. The temperature control section may transmit thermal informations as to the interconnections of the integrated circuits to the signal and imaging processing section with the system control section. According to the signals as the thermal informations fetched from the temperature control section, the system control section may control each of the sections. The temperature control section 10 may fetch signals concerned with a desirable temperature of the interconnections of the integrated circuits 1 for controlling the temperature of the conductive materials constituting the interconnections through the thermal conduction line. Such temperature control by the temperature control section through the thermal conduction line is maintained at least during the diagnosing operation of the novel diagnosing apparatus to realize a possible high sensitivity in detecting and measuring any void within the conductive materials constituting the interconnections of the integrated circuits 1.

The integrated circuits 1 may be maintained to have a suitable temperature for realizing a possible high sensitivity in detecting and sensing operations by the temperature control section in cooperation with the system control section during the diagnosing operation by the diagnosing apparatus. The high speed scanning operation of the laser beam irradiation on the entire surface of the interconnections of the integrated circuits 1 is accomplished by the laser beam scanning section in cooperation with the system control section. Any electrical current variation due to the existence of the void is detectable by the current detecting section 8 which may have the amplification function. When the laser beam 17 is irradiated on a beam spot under which a void exists, the reduction of the electrical current is detected by the current detecting section 8. Informations as to the amount of the electrical current which has been detected by the current detecting section 8 may be transmitted through the signal transmission line to the signal and image processing section 7 connected to the display device such as the CRT device 15 on which any image or a visible picture as to both the interconnections and any void involved therein may be displayed. The display deice may display the image and the visible picture with differences in luminous intensity which may be proportional to the amount of the electrical current which had been detected by the current detecting section 8. The existence of the void may represent by a dark point in the image or the visible picture on the display device such as the CRT 15 since the existence of the void within the conductive materials constituting the interconnections may render the electrical current flowing through the interconnections be reduced.

As described above, the LSI tester 16 has an ability to permit that a necessary electrical current for diagnosis operation flow through a particular interconnection in any state in which, if such a LSI tester is not provided, the particular interconnection commonly had objected any application of electrical current, except in the exceptional state. The necessary voltage supply by the LSI tester to such a particular interconnection is possible by supplying signals from the LSI tester to the integrated circuits 1. The above mentioned function of the LSI tester may permit the exact diagnosis of any interconnection which may be involved in any type of integrated circuits.

During the scanning operation of the laser beam irradiation on the interconnections of the semiconductor integrated circuits, the LSI tester 16 may apply a suitable voltage for realizing a possible high sensitivity in detecting and measuring operations for the existence of the voids as well as the temperature control section may also control and maintain the temperature of the interconnections at a suitable temperature for realizing a possible high sensitivity therein.

While in the foregoing embodiments the laser beam is utilized for supplying a heat to the conductive material such as metals, other beams such as electron beam and ion beam would be available in the present invention.

Whereas modifications of the present invention will no doubt be apparatus to a person having ordinary skill in the art, to which the invention pertains, it is to be understood that the embodiments shown and described by way of illustrations are by no means intended to cover by claims all modifications of the invention which fall within the spirit and scope of the invention.

What is claimed is:

1. An apparatus for diagnosing a void within a conductive material for interconnections of semiconductor integrated circuits comprising:

means being secured at a predetermined position at least during a diagnosing operation for holding said semiconductor integrated circuits;

means for supplying a thermal wave to interconnections of said semiconductor integrated circuits to cause a rise of a temperature of said conductive material due to a thermal accumulation around a void within said conductive material, said thermal wave supplying means being able to move in a plane for accomplishment of a scanning operation of said thermal wave supply;

means being electrically connected to said interconnections of said semiconductor integrated circuits for applying a voltage to said interconnections so as to have an electrical current flow through a part of said interconnections, which is about to be diagnosed; and means being electrically connected to said interconnections for detecting an amount of an electrical current flowing through any part of said interconnections to sense a variation of said amount thereof on account of the rise of the temperature of said conductive material due to the thermal accumulation around said void within said conductive material so as to detect any void within said conductive material constituting said interconnections.

2. The apparatus as claimed in claim 1, further comprising means being thermally connected to said semiconductor integrated circuits for controlling a temperature of said semiconductor integrated circuits at a suitable value to obtain a high sensitivity in detecting any void within said conductive material.

3. The apparatus as claimed in claim 2, wherein said temperature control means is thermally connected to said semiconductor integrated circuits through a thermal transmission line made of a thermal conductive material.

4. The apparatus as claimed in claim 2, further comprising an operation control means being electrically connected to at least each of said voltage applying means, said current detecting means and said temperature control means for both receiving informations as to an amount of said electrical current detected by said current detecting means and subsequently controlling both a voltage supplying operation of said voltage supply means and a temperature control operation of said temperature control means to keep at least during said diagnosing operation said semiconductor integrated circuits having a temperature at which an amount of said electrical current to be detected by said current detecting means be minimum to obtain a possible high sensitivity in detecting any void within said conductive materials constituting said interconnections.

5. The apparatus as claimed in claim 4 further comprising:
  a signal and image data processing means being electrically connected to each of said operation control means, said thermal wave supplying means and said current detecting means for both receiving from said thermal wave supplying means an information as to a present diagnosing position of said interconnections and receiving an information as to the amount of said electrical current from said current detecting means to analyze both said informations and subsequently process the analyzed informations as image data; and
  a display means being electrically connected to said signal and image processing means for displaying visible images of any void involved in said semiconductor integrated circuits according to said analyzed image data.

6. The apparatus as claimed in claim 4, wherein said thermal wave supplying means comprises means for irradiating a laser beam on said semiconductor integrated circuits.

7. The apparatus as claimed in claim 6, wherein said laser beam irradiating means further includes means for controlling a wavelength of a laser beam to be irradiated on said semiconductor integrated circuits in which said laser beam is so controlled as to have a wavelength longer than a critical wavelength at which an optical beam induced current is generated.

8. The apparatus as claimed in claim 7, wherein said laser beam irradiating means comprises:
  a single laser device for generating a laser beam having a predetermined wavelength;
  a single wavelength control device being optically connected to said laser device for controlling said generated laser beam having a wavelength longer than a critical wavelength at which an optical beam induced current is generated; and
  a laser beam scanning device being optically connected to said wavelength control device and being electrically connected to said operation control means for transmitting informations as to said scanning operation to said operation control means and subsequently receiving instructions as to the scanning operation from said operation control means to accomplish a high speed scanning operation according to said instructions from said operation control means.

9. The apparatus as claimed in claim 8, wherein said laser beam irradiating means further includes a microscope device being optically connected to said laser beam scanning device.

10. The apparatus as claimed in claim 1, wherein said voltage supplying means comprises a LSI tester which has an ability to apply electrical current not only to general interconnections but also compusorily to a particular interconnection which objects any current application except in an exceptional state if said LSI is not provided.

11. The apparatus as claimed in claim 4, wherein said thermal wave supplying means comprises means for irradiating an electron beam on said semiconductor integrated circuits.

12. The apparatus as claimed in claim 4, wherein said thermal wave supplying means comprises means for irradiating an ion beam on said semiconductor integrated circuits.

13. A system for diagnosing a void within a conductive material for interconnections of semiconductor integrated circuits comprising:
  a sample hold section being secured at a predetermined position at least during a diagnosing operation for holding said semiconductor integrated circuits;
  a thermal wave supplying section for supplying a thermal wave to interconnections of said semiconductor integrated circuits to cause a rise of a temperature of said conductive material due to a thermal accumulation around a void within said conductive material, said thermal wave supplying section being able to move in a plane for accomplishment of a scanning operation of said thermal wave supply;
  a voltage applying section being electrically connected to said interconnections of said semiconductor integrated circuits for applying a voltage to said interconnections so as to have an electrical current flow through a part of said interconnections, which is about to be diagnosed;

a current detecting section being electrically connected to said interconnections for detecting an amount of an electrical current flowing through any part of said interconnections to sense a variation of said amount thereof on account of the rise of the temperature of said conductive material due to the thermal accumulation around said void within said conductive material so as to detect any void within said conductive material constituting said interconnections;

a temperature control section being thermally connected to said semiconductor integrated circuits for controlling a temperature of said semiconductor integrated circuits at a suitable value to obtain a high sensitivity in detecting any void within said conductive material; and a system control section being electrically connected to at least each of said voltage applying section, said current detecting section and said temperature control section for both receiving informations as to an amount of the electrical current detected b said current detecting section and subsequently controlling both a voltage supplying operation of said voltage supply section and a temperature control operation of said temperature control section to keep at least during said diagnosing operation said semiconductor integrated circuits having a temperature at which an amount of said electrical current to be detected by said current detecting section be minimum to obtain a possible high sensitivity in detecting any void within said conductive materials constituting said interconnections.

14. The system as claimed in claim 13, wherein said temperature control section is thermally connected to said semiconductor integrated circuits through a thermal transmission line made of a thermal conductive material.

15. The system as claimed in claim 13, further comprising:

a signal and image data processing section being electrically connected to each of said system control section, said thermal wave supplying section and said current detecting section for both receiving from said thermal wave supplying section an information as to a present diagnosing position of said interconnections and receiving an information as to the amount of said electrical current from said current detecting section to analyze both said informations and subsequently process the analyzed informations as image data; and a display section being electrically connected to said signal and image processing section for displaying visible images of any void involved in said semiconductor integrated circuits according to said analyzed image data.

16. The system as claimed in claim 13, wherein said thermal wave supplying section comprises a laser beam irradiating section for irradiating a laser beam on said semiconductor integrated circuits.

17. The system as claimed in claim 16, wherein said laser beam irradiating section further includes a laser beam wavelength control section for controlling a wavelength of a laser beam to be irradiated on said semiconductor integrated circuits in which said laser beam is so controlled as to have a wavelength longer than a critical wavelength at which an optical beam induced current is generated.

18. The system as claimed in claim 17, wherein said laser beam irradiating section comprises:

a single laser device for generating a laser beam having a predetermined wavelength;

a single wavelength control device being optically connected to said laser device for controlling said generated laser beam having a wavelength longer than a critical wavelength at which an optical beam induced current is generated; and a laser beam scanning device being optically connected to said wavelength control device and being electrically connected to said system control section for transmitting informations as to said scanning operation to said system control section and subsequently receiving instructions as to the scanning operation from said system control section to accomplish a high speed scanning operation according to said instructions from said system control section.

19. The system as claimed in claim 18, wherein said laser beam irradiating section further includes a microscope device being optically connected to said laser beam scanning device.

20. The system as claimed in claim 13, wherein said voltage supplying section comprises a LSI tester which has an ability to apply electrical current not only to general interconnections but also compulsorily to a particular interconnection which objects any current application except in an exceptional state if said LSI is not provided.

21. The system as claimed in claim 13, wherein said thermal wave supplying section comprises an electron beam irradiating section for irradiating an electrical beam on said semiconductor integrated circuits.

22. The system as claimed in claim 13, wherein said thermal wave supplying section comprises an ion beam irradiating section for irradiating an ion beam on said semiconductor integrated circuits.

* * * * *